(12) United States Patent
Kim et al.

(10) Patent No.: US 8,866,288 B2
(45) Date of Patent: Oct. 21, 2014

(54) SEMICONDUCTOR PACKAGE

(71) Applicant: Samsung Electro-Mechanics Co., Ltd., Suwon (KR)

(72) Inventors: Jong Man Kim, Suwon (KR); Young Hoon Kwak, Suwon (KR); Chang Seob Hong, Suwon (KR); Soon Gyu Yim, Suwon (KR)

(73) Assignee: Samsung Electro-Mechanics Co., Ltd., Gyunggi-DO (KR)

( * ) Notice: Subject to any disclaimer, the term of this patent is extended or adjusted under 35 U.S.C. 154(b) by 105 days.

(21) Appl. No.: 13/735,667

(22) Filed: Jan. 7, 2013

(65) Prior Publication Data

US 2014/0110830 A1  Apr. 24, 2014

(30) Foreign Application Priority Data

Oct. 18, 2012  (KR) ........................ 10-2012-0116069

(51) Int. Cl.
*H01L 23/10* (2006.01)
*H01L 23/34* (2006.01)

(52) U.S. Cl.
CPC ..................................... *H01L 23/34* (2013.01)

USPC ........................... 257/706; 257/707; 257/666

(58) Field of Classification Search
CPC ... H01L 24/48; H01L 23/49575; H01L 24/40; H01L 25/0652; H01L 23/10; H01L 23/34
USPC .......... 257/666, 676, 691, 706, 707, 723, 724
See application file for complete search history.

(56) References Cited

U.S. PATENT DOCUMENTS

| 5,466,969 | A  | * | 11/1995 | Tsunoda ....................... 257/706 |
| 6,291,880 | B1 | * | 9/2001  | Ogawa et al. ................. 257/723 |
| 6,432,750 | B2 |   | 8/2002  | Jeon et al. |
| 7,372,146 | B2 | * | 5/2008  | Sato ............................. 257/706 |
| 2003/0011054 | A1 | * | 1/2003 | Jeun et al. ...................... 257/678 |
| 2007/0267739 | A1 | * | 11/2007 | Kajiwara et al. .............. 257/707 |
| 2009/0321924 | A1 | * | 12/2009 | Funakoshi et al. ............ 257/722 |
| 2013/0069210 | A1 | * | 3/2013  | Lee et al. ...................... 257/666 |

* cited by examiner

*Primary Examiner* — S. V. Clark
(74) *Attorney, Agent, or Firm* — Ladas & Parry, LLP (57) ABSTRACT

Disclosed herein is a semiconductor package, including: a first heat radiating plate; a second heat radiating plate formed below the first heat radiating plate; a heat radiating lead formed above the first heat radiating plate and having both ends contacted with the second heat radiating plate; an insulating layer formed above the heat radiating lead; at least one power device formed above the insulating layer; and at least one control device formed above the insulating layer.

11 Claims, 6 Drawing Sheets

Prior art

FIG.6

Prior art

SEMICONDUCTOR PACKAGE

CROSS REFERENCE TO RELATED APPLICATION

This application claims the benefit of Korean Patent Application No. 10-2012-0116069, filed on Oct. 18, 2012, entitled "Semiconductor Package", which is hereby incorporated by reference in its entirety into this application.

BACKGROUND OF THE INVENTION

1. Technical Field

The present invention relates to a semiconductor package.

2. Description of the Related Art

In accordance with the recent development in the electronic industry, the demand for high-functional electronic components has been rapid increased. In addition, by the demand for the electronic components to be lighter, thinner, shorter and smaller, many electronic components need to be integrated in a small area on a circuit board when the electronic components are mounted on the circuit board.

Meanwhile, a high-power device generating a high-temperature heat, such as, a power device, a light emitting diode (LED), or the like, is mounted on the circuit board. In the case where the heat generated from the high-power device is not promptly emitted, the temperature of the circuit board is raised, which causes malfunction and erroneous operation of the power device. For this reason, semiconductor packages having improved heat radiation are being researched.

In the semiconductor package of the prior art, a power device radiating high-temperature heat and a control device vulnerable to heat are simultaneously mounted above a heat radiation plate (U.S. Pat. No. 6,432,750). Here, the generated heat can be radiated to the outside only through the heat radiation plate. That is, the number of paths along which the heat generated from the power device and the control device moves is only one. In addition, since the power device and the control device are mounted above the same heat radiation plate, the heat generated from the power device may be conducted to the control device through the heat radiation plate. Therefore, the control device may be affected by the heat generated from the power device, resulting in an erroneous operation.

SUMMARY OF THE INVENTION

The present invention has been made in an effort to provide a semiconductor package capable of improving efficiency in heat radiation.

The present invention has been also made in an effort to provide a semiconductor package allowing thermal separation between a power device and a control device.

The present invention has been also made in an effort to provide a semiconductor package capable of having excellent reliability by improving efficiency in heat radiation and thermal separation.

According to a preferred embodiment of the present invention, there is provided a semiconductor package, including: a first heat radiating plate; a second heat radiating plate formed below the first heat radiating plate; a heat radiating lead formed above the first heat radiating plate and having both ends contacted with the second heat radiating plate; an insulating layer formed above the heat radiating lead; at least one power device formed above the insulating layer; and at least one control device formed above the insulating layer.

The semiconductor package may further include a mold covering the first heat radiating plate, the insulating layer, the power device, and the control device.

The semiconductor package may further include a connection lead having one end formed between at least one of the power device and the control device and the insulating layer and the other end formed to be exposed out of the mold.

The heat radiating lead may include: a first heat radiating lead formed below the insulating layer correspondingly to a region where the power device is mounted; and a second heat radiating lead formed below the insulating layer correspondingly to a region where the control device is mounted, the first heat radiating lead and the second heat radiating lead being connected to each other.

The heat radiating lead may include: a first heat radiating lead formed below the insulating layer correspondingly to a region where the power device is mounted; and a second heat radiating lead formed below the insulating layer correspondingly to a region where the control device is mounted, the first heat radiating lead and the second heat radiating lead being separated from each other.

The first heat radiating plate may be formed of aluminum.

The heat radiating lead may be formed of copper.

The mold may be formed of an epoxy mold compound (EMC) or a silicon gel.

The semiconductor package may further include an adhesive layer formed between the first heat radiating plate and the second heat radiating plate.

The adhesive layer may be formed of thermal grease.

The connection lead may be formed of a conductive metal.

BRIEF DESCRIPTION OF THE DRAWINGS

The above and other objects, features, and advantages of the present invention will be more clearly understood from the following detailed description taken in conjunction with the accompanying drawings, in which.

DESCRIPTION OF THE PREFERRED EMBODIMENTS

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Figure 1:
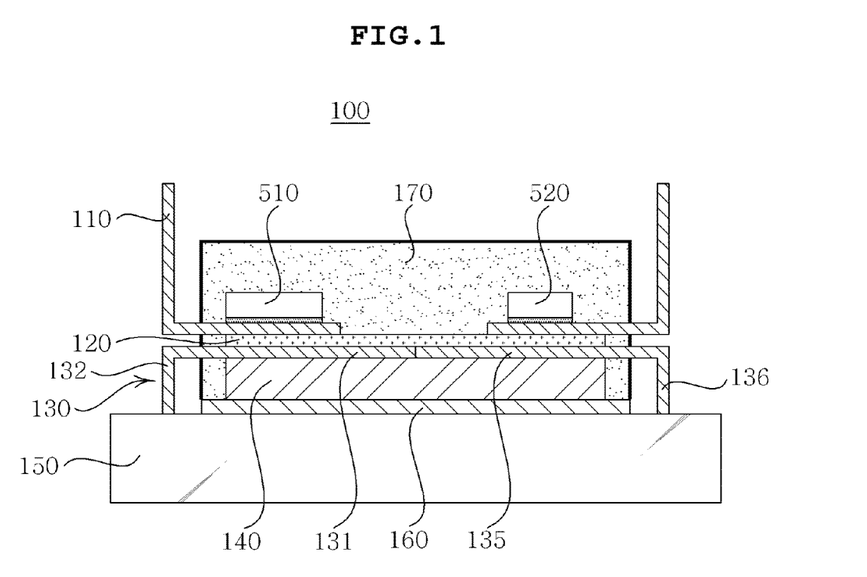
FIG. 1 is an exemplified view showing a semiconductor package according to one preferred embodiment of the present invention.

FIG. 1 is an exemplified view showing a semiconductor package according to one preferred embodiment of the present invention.

Referring to FIG. 1, a semiconductor package 100 may include connection leads 110, an insulating layer 120, a heat radiating lead 130, a first heat radiating plate 140, a second heat radiating plate 150, an adhesive layer 160, a mold 170, a power device 510, and a control device 520.

The power device 510 and the control device 520 may be formed above the connection leads 110 or the insulating layer 120. When the power device 510 and the control device 520 are formed above the connection leads 110, they may be electrically connected with the connection leads 110. Alternately, when the power device 510 and the control device 520 are formed above the insulating layer 120, they may be electrically connected with circuit patterns (not shown) formed above the insulating layer 120.

The connection leads 110 may be formed between at least one of the power device 510 and the control device 520 and the insulating layer 120. The connection leads 110 may be electrically connected with the power device 510 and the control device 520. The connection leads 110 may be partially exposed out of the mold 170 to thereby electrically connect the power device 510 and the control device 520 to the outside. The connection leads 110 may be formed of an electrically conductive metal. For example, the connection leads 110 may be formed of at least one of gold, silver, copper, and nickel.

The insulating layer 120 may be formed below the connection leads 110. The insulating layer 120 may be formed for electric insulation between the second heat radiating plate 150 and the heat radiating lead 130 and the connection leads 110. The insulating layer 120 may be formed of an epoxy based organic insulating material. The insulating layer 120 may be formed of any one of known insulating materials, in addition to the epoxy based organic insulating material. Although not shown in FIG. 1, circuit patterns may be formed above and inside the insulating layer 120. The circuit patterns may be electrically connected with at least one of the connection leads 110, the power device 510, and the control device 520.

The heat radiating lead 130 may be formed below the insulating layer 120. The heat radiating lead 130 may transfer heat generated from the power device 510 or the control device 520 to the second heat radiating plate 150. The heat radiating lead 130 may include a first heat radiating lead 131 and a second heat radiating lead 135. The first heat radiating lead 131 may be formed below the insulating layer 120 correspondingly to a region where the power device 510 is mounted. In addition, the second heat radiating lead 135 may be formed below the insulating layer 120 correspondingly to a region where the control device 520 is mounted. Here, the first heat radiating lead 131 and the second heat radiating lead 135 may be formed integrally with each other so that they are connected with each other. That is, the heat radiating lead 130 may be contacted with the whole lower surface of the insulating layer 120.

Both ends 132 and 136 of the heat radiating lead 130 may be connected with the second heat radiating plate 150. Since both ends 132 and 136 of the heat radiating lead 130 are connected with the second heat radiating plate 150, some of the heat generated from the power device 510 and the control device 520 may be directly transferred to the second heat radiating plate 150. Here, heat that is not directly transferred to the second heat radiating plate 150 through the heat radiating lead 130 may be transferred to the first heat radiating plate 140. The heat radiating lead 130 may be formed of a thermally conductive metal. For example, the heat radiating lead 130 may be formed of copper.

The first heat radiating plate 140 may be formed below the heat radiating lead 130. The first heat radiating plate 140 may transfer the heat transferred from the heat radiating lead 130 to the second heat radiating plate 150. In the present preferred embodiment, the second heat radiating plate 150 may be formed of aluminum (Al). However, a material for the first heat radiating plate 140 is not limited to aluminum. That is, the first heat radiating plate 140 may be formed of a material having high thermal conductivity. For example, the first heat radiating plate 140 may include at least one of copper (Cu), molybdenum (Mo), tungsten (W), titanium (Ti), and magnesium (Mg), in addition to aluminum (Al).

The second heat radiating plate 150 may be formed below the first heat radiating plate 140. In addition, the second heat radiating plate 150 may be connected with both ends 132 and 136 of the heat radiating lead 130. The second heat radiating plate 150 may transfer the heat transferred from the first heat radiating plate 140 and the heat radiating lead 130 to the outside. For example, the second heat radiating plate 150 may be a heat sink.

The adhesive layer 160 may be formed between the first heat radiating plate 140 and the second heat radiating plate 150. The adhesive layer 160 may be formed to fix the first heat radiating plate 140 and the second heat radiating plate 150 to each other. In addition, the adhesive layer 160 may serve to transfer the heat of the first heat radiating plate 140 to the second heat radiating plate 150. For example, the adhesive layer 160 may be formed of thermal grease.

The mold 170 may be formed to protect the semiconductor package 100 from external impact. The mold 170 may cover the first heat radiating plate 140, the insulating layer 120, the power device 510, and the control device 520. For example, the mold 170 may be formed of an epoxy mold compound (EMC) or a silicone gel.

The semiconductor package 100 according to the present preferred embodiment can add another heat radiating path by forming the heat radiating lead 130 connected with the second heat radiating plate 150. The added heat radiating path can improve efficiency in heat radiation.

Figure 2:
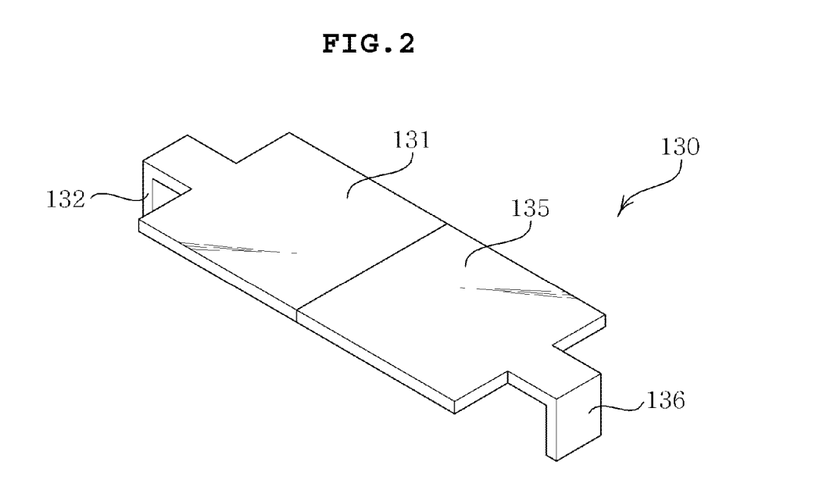
FIG. 2 is an exemplified view showing a heat radiating lead according to one preferred embodiment of the present invention.

FIG. 2 is an exemplified view showing a heat radiating lead according to one preferred embodiment of the present invention.

Referring to FIG. 2, the heat radiating lead 130 may include the first heat radiating lead 131 and the second heat radiating lead 135. The first heat radiating lead 131 may be formed below the insulating layer (120 in FIG. 1) correspondingly to a region where the power device (510 in FIG. 1) is mounted. Here, one end 132 of the first heat radiating lead 131 may be connected with the second heat radiating plate 150. That is, the first heat radiating lead 131 may directly transfer some of the heat transferred from the power device (510 in FIG. 1) to the second heat radiating plate 150 through one end 132 thereof. Here, the first heat radiating lead 131 may transfer the heat that is not directly transferred to the second heat radiating plate 150 to the first heat radiating plate 140. The second heat radiating lead 135 may be formed below the insulating layer (120 in FIG. 1) correspondingly to a region where the control device (520 in FIG. 1) is mounted. Here, the other end 136 of the second heat radiating lead 135 may also be connected with the second heat radiating plate 150. That is, the second heat radiating lead 135 may directly transfer some of the heat transferred from the control device (520 in FIG. 1) to the second heat radiating plate 150 through the other end 136 thereof. Here, the second heat radiating lead 135 may transfer the heat that is not directly transferred to the second heat radiating plate 150 to the first heat radiating plate 140.

For convenience of explanation of the present invention, the first heat radiating lead 131 and the second heat radiating lead 135 are differentiated from each other depending on the position where the heat radiating lead 130 is formed. However, the first heat radiating lead 131 and the second heat radiating lead 135 are not formed separately from each other, but may be formed integratedly with each other as shown in FIG. 2.

Figure 3:
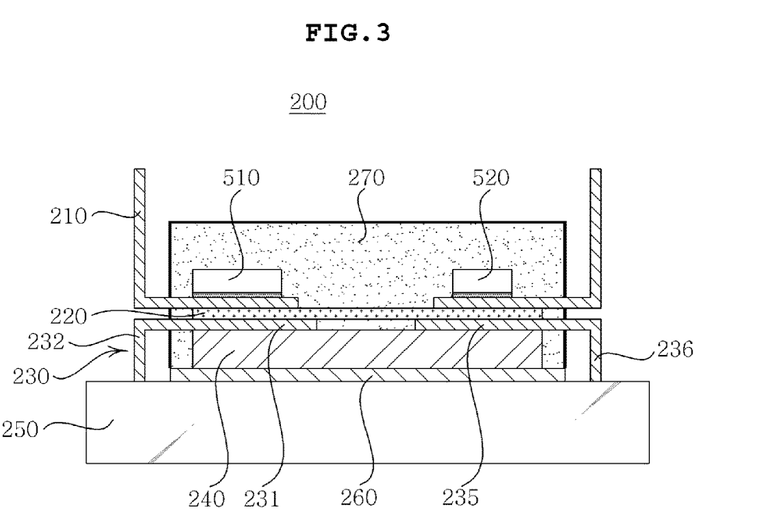
FIG. 3 is an exemplified view showing a semiconductor package according to another preferred embodiment of the present invention.

FIG. 3 is an exemplified view showing a semiconductor package according to another preferred embodiment of the present invention.

Referring to FIG. 3, a semiconductor package 200 may include a first heat radiating plate 240, a second heat radiating plate 250, a heat radiating lead 230, an insulating layer 220, a mold 270, connection leads 210, a power device 510, and a control device 520.

The connection leads 210 may be formed between at least one of the power device 510 and the control device 520 and the insulating layer 220. The connection leads 210 may be electrically connected with the power device 510 and the control device 520. The connection leads 210 may be partially exposed out of the mold 270 to thereby electrically connect the power device 510 and the control device to the outside. The connection leads 210 may be formed of an electrically conductive metal. For example, the connection leads 210 may be formed of at least one of gold, silver, copper, and nickel.

The insulating layer 220 may be formed below the connection leads 210. The insulating layer 220 may be formed for electric insulation between the second heat radiating plate 250 and the heat radiating lead 230 and the connection leads 210. The insulating layer 220 may be formed of an epoxy based organic insulating material. The insulating layer 220 may be formed of any one of known insulating materials, in addition to the epoxy based organic insulating material. Although not shown in FIG. 3, circuit patterns may be formed above and inside the insulating layer 220. The circuit patterns may or may not be electrically connected with at least one of the connection leads 210, the power device 510, and the control device 520.

The heat radiating lead 230 may be formed below the insulating layer 220. The heat radiating lead 230 may transfer heat generated from the power device 510 or the control device 520 to the second heat radiating plate 250. The heat radiating lead 230 may include a first heat radiating lead 231 and a second heat radiating lead 235. The first heat radiating lead 231 may be formed below the insulating layer 220 correspondingly to a region where the power device 510 is mounted. In addition, the second heat radiating lead 235 may be formed below the insulating layer 220 correspondingly to a region where the control device 520 is mounted. Here, the first heat radiating lead 231 and the second heat radiating lead 235 may be formed separately from each other. Like the present preferred embodiment of the present invention, the first heat radiating lead 231 and the second heat radiating lead 235 are separated from each other, thereby allowing thermal separation between the power device 510 and the control device 520. That is, the heat from the power device 510 generating a large amount of heat can be prevented from being transferred to the control device 520 through the heat radiating lead 230. Both ends 232 and 236 of the heat radiating lead 230 may be connected with the second heat radiating plate 250. Since both ends 232 and 236 of the heat radiating lead 230 are connected with the second heat radiating plate 250, some of the heat generated from the power device 510 and the control device 520 may be directly transferred to the second heat radiating plate 250. Here, heat that is not directly transferred to the second heat radiating plate 250 through the heat radiating lead 230 may be transferred to the first heat radiating plate 240. The heat radiating lead 230 may be formed of a thermally conductive metal. For example, the heat radiating lead 230 may be formed of copper.

The first heat radiating plate 240 may be formed below the heat radiating lead 230. The first heat radiating plate 240 may transfer the heat transferred from the heat radiating lead 230 to the second heat radiating plate 250. In the present preferred embodiment, the second heat radiating plate 250 may be formed of aluminum (Al). However, a material for the first heat radiating plate 240 is not limited to aluminum. That is, the first heat radiating plate 240 may be formed of a material having high thermal conductivity. For example, the first heat radiating plate 240 may include at least one of copper (Cu), molybdenum (Mo), tungsten (W), titanium (Ti), and magnesium (Mg), in addition to aluminum (Al).

The second heat radiating plate 250 may be formed below the first heat radiating plate 240. In addition, the second heat radiating plate 250 may be connected with both ends 232 and 236 of the heat radiating lead 230. The second heat radiating plate 250 may transfer the heat transferred from the first heat radiating plate 240 and the heat radiating lead 230 to the outside. For example, the second heat radiating plate 250 may be a heat sink.

The adhesive layer 260 may be formed between the first heat radiating plate 240 and the second heat radiating plate 250. The adhesive layer 260 may be formed to fix the first heat radiating plate 240 and the second heat radiating plate 250 to each other. In addition, the adhesive layer 260 may serve to transfer the heat of the first heat radiating plate 240 to the second heat radiating plate 250. For example, the adhesive layer 260 may be formed of thermal grease.

The mold 270 may be formed to protect the semiconductor package 200 from external impact. The mold 270 may cover the first heat radiating plate 240, the insulating layer 220, the power device 510, and the control device 520. For example, the mold 270 may be formed of an epoxy mold compound (EMC) or a silicone gel.

The semiconductor package 200 according to the present preferred embodiment can add another heat radiating path by forming the heat radiating lead 230 connected with the second heat radiating plate 250. In addition, the first heat radiating lead 231 formed below the power device 510 and the second heat radiating lead 235 formed below the control device 520 are separated from each other, to thereby be thermally separated from each other. Therefore, the semiconductor package 200 allows thermal separation, and can improve efficiency in heat radiation by the heat radiating lead 230 capable of forming an additional heat radiating path.

Figure 4:
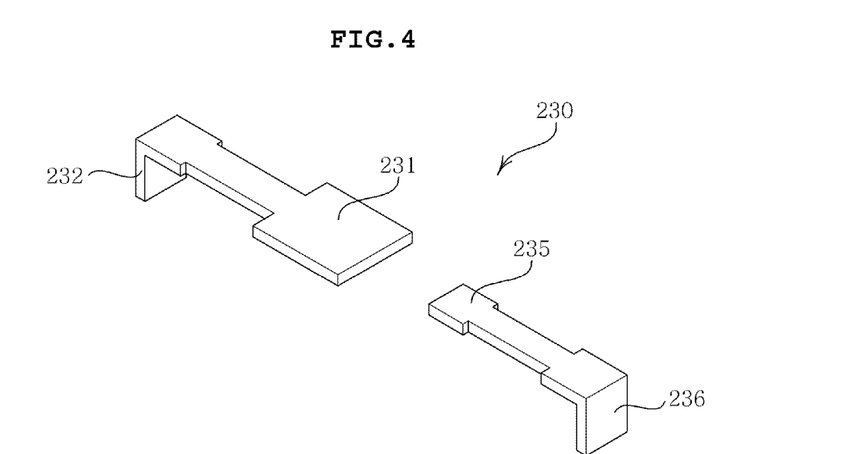
FIG. 4 is an exemplified view showing a heat radiating lead according to another preferred embodiment of the present invention.

FIG. 4 is an exemplified view showing a heat radiating lead according to another preferred embodiment of the present invention.

Referring to FIG. 4, the heat radiating lead 230 may include the first heat radiating lead 231 and the second heat radiating lead 235. The first heat radiating lead 231 may be formed below the insulating layer (220 in FIG. 3) correspondingly to a region where the power device (510 in FIG. 3) is mounted. Here, one end 232 of the first heat radiating lead 231 may be connected with the second heat radiating plate 250. That is, the first heat radiating lead 231 may directly transfer some of the heat transferred from the power device (510 in FIG. 3) to the second heat radiating plate 250 through one end 232 thereof. Here, the first heat radiating lead 231 may transfer the heat that is not directly transferred to the second heat radiating plate 250 to the first heat radiating plate 240. The second heat radiating lead 235 may be formed below the insulating layer (220 in FIG. 3) correspondingly to a region where the control device (520 in FIG. 3) is mounted. Here, the other end 236 of the second heat radiating lead 235 may be also connected with the second heat radiating plate 250. That is, the second heat radiating lead 235 may directly transfer some of the heat transferred from the control device (520 in FIG. 3) to the second heat radiating plate 250 through the other end 236 thereof. Here, the second heat radiating lead 235 may transfer the heat that is not directly transferred to the second heat radiating plate 250 to the first heat radiating plate 240.

According to the present embodiment, the heat radiating lead 230 may have a structure where the first heat radiating lead 231 and the second heat radiating lead 235 are separated from each other. Here, the first heat radiating lead 231 is formed below the power device (510 in FIG. 3) generating a large amount of heat, so that the first heat radiating lead 231 may be patterned to have a wider area than the second heat radiating lead 235 formed below the control device (520 in FIG. 3). The pattern shape of the first heat radiating lead 231 and the second heat radiating lead 235 may be easily changed by those skilled in the art. As such, the first heat radiating lead 231 and the second heat radiating lead 235 are separated from each other, thereby preventing the heat generated from the power device 510 from being transferred to the control device 520 through the heat radiating lead 230.

Figure 5:
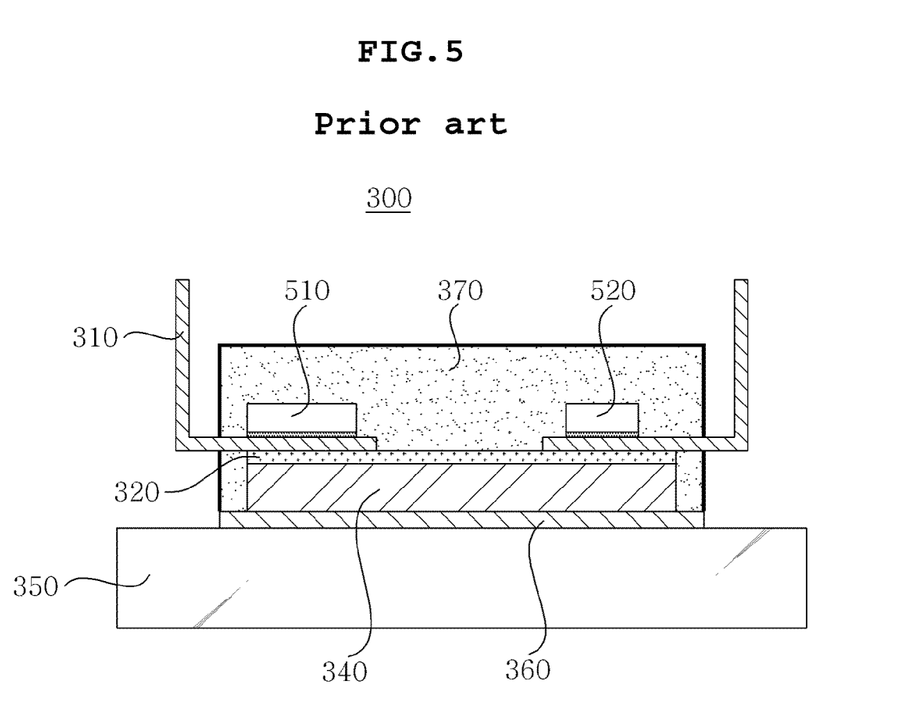
FIGS. 5 and 6 are exemplified views showing a semiconductor package according to the prior art and thermal analysis simulation results thereof, respectively.
Figure 6:
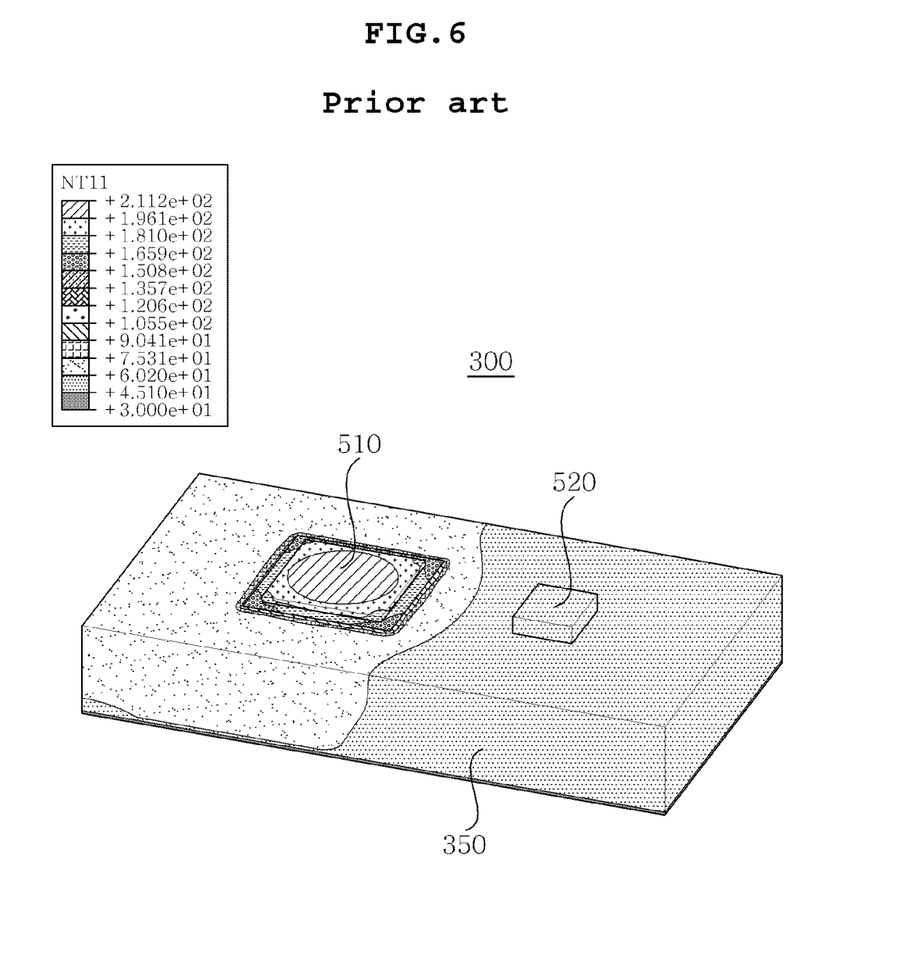

FIGS. 5 and 6 are exemplified views showing a semiconductor package according to the prior art and thermal analysis simulation results thereof, respectively.

Referring to FIG. 5, a semiconductor package 300 of the prior art may include connection lead 310, an insulating layer 320, a first heat radiating plate 340, a second heat radiating plate 350, an adhesive layer 360, and a mold 370. However, the semiconductor package 300 of the prior art has a structure where the heat radiating lead (130 in FIG. 1 or 230 in FIG. 3) according to the embodiment of the preset invention is not formed. That is, the semiconductor package 300 of the prior art does not have a structure for addition of another heat radiating path or thermal separation between the power device 510 and the control device 520.

Referring to FIG. 6, thermal analysis simulation conditions of the semiconductor package 300 of the prior art as shown in FIG. 5 are that the temperature for a bottom surface of the second heat radiating plate 350 is 30 and the heat loss of the power device is 50 W/mm$^3$. Here, the temperature of the power device 510 is 211 and the temperature of the control device 520 is 53.

Figure 7:
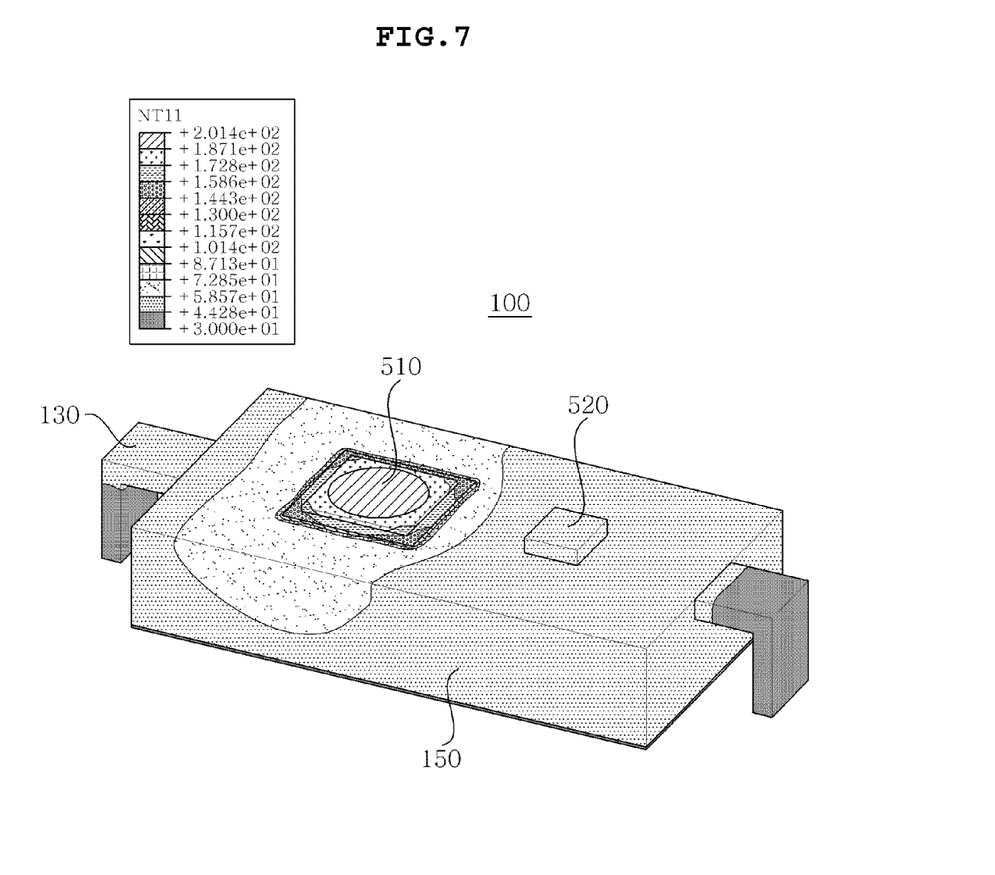
FIG. 7 is an exemplified view showing thermal analysis simulation results of the semiconductor package according to one preferred embodiment of the present invention.

FIG. 7 is an exemplified view showing thermal analysis simulation results of the semiconductor package according to one preferred embodiment of the present invention.

Referring to FIG. 7, the semiconductor package 100 according to one embodiment of the present invention as shown in FIG. 1 may include the heat radiating lead 130 having an integral structure of FIG. 2. Here, thermal analysis simulation conditions of the semiconductor package 100 according to one embodiment of the present invention are that the temperature for a bottom surface of the second heat radiating plate 150 is 30 and the heat loss of the power device 510 is 50 W/mm$^3$. The temperature of the power device 510 is 201 and the temperature of the control device 520 is 52. When the power device 510 and the control device 520 of the semiconductor package 100 of FIG. 1 are compared with those of the semiconductor package 300 of the prior art shown in FIGS. 5 and 6, it can be confirmed that the semiconductor package 100 according to one embodiment of the present invention is more efficient in heat radiation.

Figure 8:
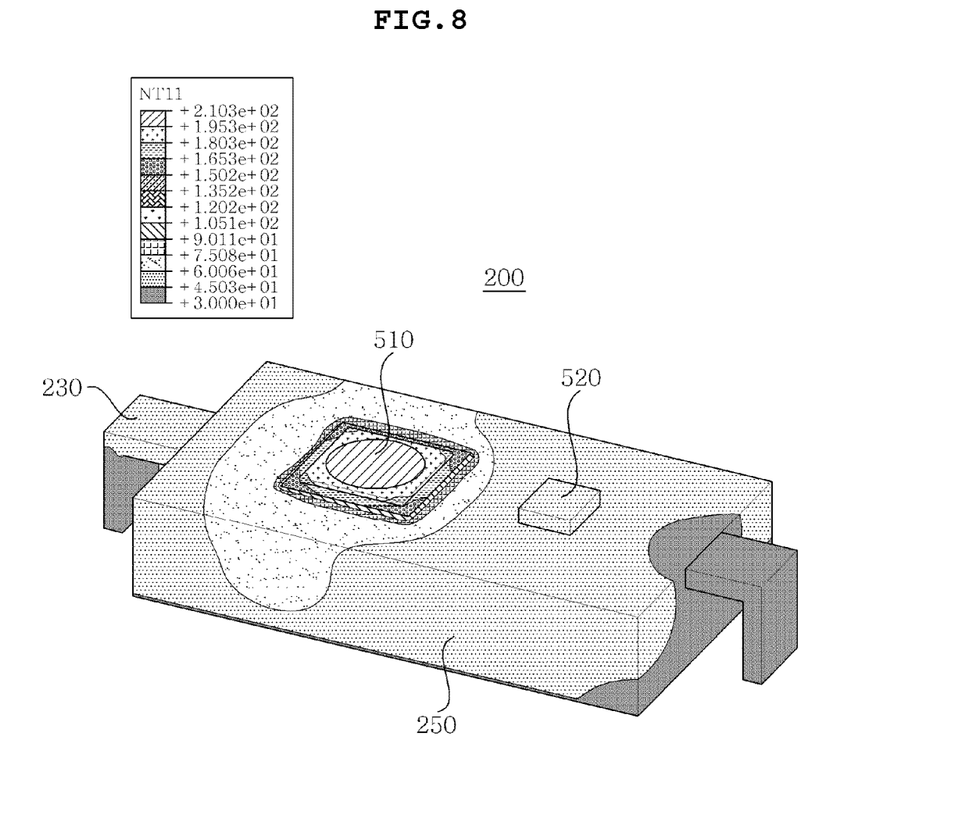
FIG. 8 is an exemplified view showing thermal analysis simulation results of the semiconductor package according to another preferred embodiment of the present invention.

FIG. 8 is an exemplified view showing thermal analysis simulation results of the semiconductor package according to another preferred embodiment of the present invention.

Referring to FIG. 8, the semiconductor package 200 according to another embodiment of the present invention as shown in FIG. 3 may include the heat radiating lead 230 having a separation type structure of FIG. 4. Here, thermal analysis simulation conditions of the semiconductor package 200 according to another embodiment of the present invention are that the temperature for a bottom surface of the second heat radiating plate 250 is 30 and the heat loss of the power device 510 is 50 W/mm$^3$. The temperature of the power device 510 is 210 and the temperature of the control device 520 is 49. When the power device 510 and the control device 520 of the semiconductor package 200 of FIG. 3 are compared with those of the semiconductor 300 of the prior art shown in FIGS. 5 and 6, it can be confirmed that the semiconductor package 200 according to another embodiment of the present invention is more efficient in heat radiation.

In addition, in the semiconductor package 300 of the prior art shown in FIGS. 5 and 6, the temperature difference between the power device 510 and the control device 520 is 158. In the semiconductor package 200 according to another embodiment of the present invention shown in FIG. 3, the temperature difference between the power device 510 and the control device 520 is 161. That is, it can be confirmed that the semiconductor package 200 including the heat radiating lead 230 having a separation type structure is more efficient than the semiconductor package 300 of the prior art in view of thermal separation between the power device 510 and the control device 520.

As set forth above, according to the semiconductor package of the present invention, the efficiency in heat radiation can be improved by forming an additional heat radiating path through the heat radiating lead.

Further, according to the semiconductor package of the present invention, thermal separation between the power device and the control device can be possible by using the heat radiating lead having a separation type structure.

Further, according to the semiconductor package of the present invention, the efficiency in heat radiation and thermal separation are allowed, thereby improving reliability.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:
1. A semiconductor package, comprising:
a first heat radiating plate;

a second heat radiating plate formed below the first heat radiating plate;

a heat radiating lead formed above the first heat radiating plate and having both ends contacted with the second heat radiating plate;

an insulating layer formed above the heat radiating lead;

at least one power device formed above the insulating layer; and at least one control device formed above the insulating layer.

2. The semiconductor package as set forth in claim 1, further comprising a mold covering the first heat radiating plate, the insulating layer, the power device, and the control device.

3. The semiconductor package as set forth in claim 2, further comprising a connection lead having one end formed between at least one of the power device and the control device and the insulating layer and the other end formed to be exposed out of the mold.

4. The semiconductor package as set forth in claim 1, wherein the heat radiating lead includes:

a first heat radiating lead formed below the insulating layer correspondingly to a region where the power device is mounted; and a second heat radiating lead formed below the insulating layer correspondingly to a region where the control device is mounted, the first heat radiating lead and the second heat radiating lead being connected to each other.

5. The semiconductor package as set forth in claim 1, wherein the heat radiating lead includes:

a first heat radiating lead formed below the insulating layer correspondingly to a region where the power device is mounted; and a second heat radiating lead formed below the insulating layer correspondingly to a region where the control device is mounted, the first heat radiating lead and the second heat radiating lead being separated from each other.

6. The semiconductor package as set forth in claim 1, wherein the first heat radiating plate is formed of aluminum.

7. The semiconductor package as set forth in claim 1, wherein the heat radiating lead is formed of copper.

8. The semiconductor package as set forth in claim 2, wherein the mold is formed of an epoxy mold compound (EMC) or a silicon gel.

9. The semiconductor package as set forth in claim 1, further comprising an adhesive layer formed between the first heat radiating plate and the second heat radiating plate.

10. The semiconductor package as set forth in claim 9, wherein the adhesive layer is formed of thermal grease.

11. The semiconductor package as set forth in claim 3, wherein the connection lead is formed of a conductive metal.

* * * * *